United States Patent [19]

Bertone

[11] Patent Number: 5,224,513
[45] Date of Patent: Jul. 6, 1993

[54] DEVICE FOR INTRODUCING REAGENTS INTO AN ORGANOMETALLIC VAPOR PHASE DEPOSITION APPARATUS

[75] Inventor: Daniele Bertone, Turin, Italy

[73] Assignee: Cselt - Centro Studi E Laboratori Telecomunicazioni S.p.A., Torino, Italy

[21] Appl. No.: 856,243

[22] Filed: Mar. 25, 1992

[30] Foreign Application Priority Data

Jun. 4, 1991 [IT] Italy ............... TO 91 U 000129

[51] Int. Cl.$^5$ ............................................. F16K 11/00
[52] U.S. Cl. ................................... 137/597; 137/240; 137/885
[58] Field of Search ............... 137/597, 884, 885, 240, 137/597

[56] References Cited

U.S. PATENT DOCUMENTS

| | | | |
|---|---|---|---|
| 4,196,748 | 4/1980 | Gillespie | 137/597 X |
| 4,846,226 | 7/1989 | Merritt | 137/885 X |
| 4,869,301 | 9/1989 | Ohmi et al. | 137/240 X |
| 4,917,136 | 4/1990 | Ohmi et al. | 137/240 X |
| 5,123,443 | 6/1992 | Garrison | 137/597 X |

OTHER PUBLICATIONS

Journal of Crystal Growth, No. 77, 1986, R. S. Sillmon et al. pp. 73-78 North-Holland, Amsterdam.

*Primary Examiner*—John C. Fox
*Attorney, Agent, or Firm*—Herbert Dubno

[57] ABSTRACT

The device for introducing reagents into an organometallic vapor phase deposition apparatus consists of a valve body having two chambers, each of which can be placed in communication with a passage for the introduction of the reagent and is permanently connected with two passages traversed by carrier gas.

1 Claim, 2 Drawing Sheets

DEVICE FOR INTRODUCING REAGENTS INTO AN ORGANOMETALLIC VAPOR PHASE DEPOSITION APPARATUS

FIELD OF THE INVENTION

The present invention relates to a plant or apparatus for fabricating semiconductor devices and more particularly, to a device for introducing reagents into an organometallic vapor phase deposition apparatus.

As is known, many electronic devices, more particularly, many optoelectronic devices used in optical fiber transmission systems, such as lasers, and photodetectors, consist of semiconducting material structures formed of various monocrystalline layers with different compositions within the indium, gallium, arsenic and phosphor system and with thicknesses comprised between fractions of a micron and a few microns.

The individual layers are obtained by depositing appropriate compounds on a starting substrate using for the operation different methods, among which MOCVD (Metal-Organic Chemical Vapor Deposition) is widely employed. According to this method the sources of metals, like Ga, In, consist of organometallic compounds, while the precursors of nonmetals, like As, P, consist of the corresponding hydrides.

During deposition, mixtures of the reagents above are transported by use of carrier gases, like $H_2$, Ar, in reactor in which the starting substrate is present, kept at convenient temperature. As they arrive there, they react with each other, yielding the desired semiconducting material which is deposited on the substrate. To obtain different layers the flow of reagent with a certain composition is replaced by a flow of reagents with a different composition, trying at the same time to keep all the other physical conditions unchanged, so as to avoid the formation of layers with uncontrolled composition.

According to the so-called vent/run method, described in the article entitled "An ultra-fast gas delivery system for producing abrupt compositional switching in OMVPE", written by R. S. Sillmon et al, pages 73-78 of the Journal of Crystal Growth, No. 77, 1986, the gaseous flow in the line of each reagent is never halted, but switched either to the reactor (run line) or to an exhaust line (vent line).

The changeover between the two directions is obtained by acting on valves, which by halting the reagent flow or by letting it through, allows the reagent to be routed towards the desired line, thus obtaining also the purging of manifolds prior to the immission of the new flow into the reactor. To obtain this, the valves are activated in opposite manner, i.e. when one is OFF, the other is ON.

In addition, because it be of main importance that the composition of each layer is constant and the transition from one layer to another be well defined, flow changeover in the reactor must take place as quickly as possible, so as to reduce to the minimum reagent stagnation in dead spaces of valves and manifolds, which for this reason must present low volumes.

Reagent flow changeover can take place without abrupt pressure variation if pressures in vent and run lines are equal. Pressure balancing is usually obtained by an electronic control system using a differential manometer for measuring pressure differences and a flowmeter for adjusting carrier gas flow in an additional line. By this line, carrier gas is injected into the line at a lower pressure until pressure values are balanced again. However a certain delay in control system response cannot be avoided, especially if line volumes are not negligible.

Furthermore, in known vent/run systems the reagent stagnation problem is not completely solved, since two valves joined with a pipe segment of non-negligible length are usually used for the operation, owing to valve dimensions. Since the portion of pipe segment leading to the valve switched OFF and dead spaces of the valve itself are cut off from the flow, stagnation of a certain amount of reagent is unavoidable.

SUMMARY OF THE INVENTION

These drawbacks are overcome by the device for introducing reagents into an organometallic vapor phase deposition apparatus, provided by the present invention, which, comprising a single valve body and no longer requiring pipe segments, presents a considerable reduction in dead spaces, encumbrance and leakage losses through joints. The apparatus is subjected to continuous purging in all its internal zones, whether the reagent is sent to the exhaust line or to the reactor, or the flow is halted. The present device can directly replace the pair of valves usually used in a vent/run system.

The present invention thus provides a device for introducing reagents into an organometallic vapour phase deposition apparatus, which has five passages for routing reagent and carrier gases and two inlets for letting in compressed air to control pneumatic actuators provided for switching flows between different passages.

BRIEF DESCRIPTION OF THE DRAWING

The above and other objects, features and advantages of the present invention will become more readily apparent from the following description, reference being made to the accompanying drawing in which.

The foregoing and other characteristics of the present invention will be made clearer by the following description and by the annexed drawing wherein.

SPECIFIC DESCRIPTION

Figure 1:
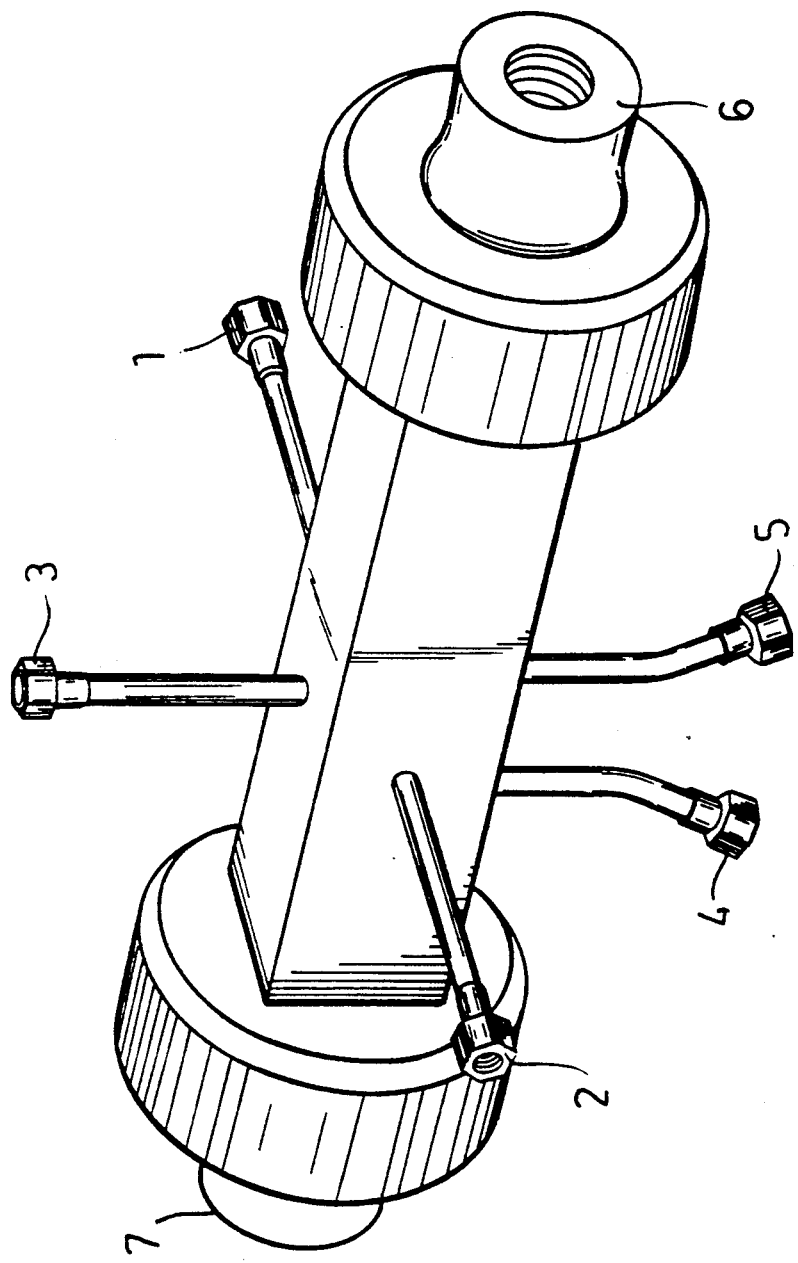
FIG. 1 is a perspective view of the device.

The perspective view of FIG. 1 shows the device, comprising a valve body provided with five passages 1,2,3,4 and 5 for reagent and carrier gas transit. Two inlets 6 and 7 allow compressed air to be let in for controlling pneumatic actuators, which switch flows between different passages.

More particularly, the reagent, which can be pure or mixed with carrier gas, is injected through input passage 1.

A carrier gas enters through passage 2 and goes out through passage 5 without undergoing any control inside the device. Analogously, a carrier gas enters through passage 3 and goes out through passage 4 without undergoing any control. Passages 2 and 3 can, e.g., be part of the carrier gas line and ways 5 and 4 can be part of a line leading to the reactor and to an exhaust.

During the usual operation the actuators are activated by compressed air injected through inlets 6 and 7 so as to connect passage 1 with the continuous flow traversing passages 2 and 5, thus sending the reagent to the reactor, or so as to put in communication way 1 with continuous flow traversing passages 3 and 4, thus venting the reagent towards the exhaust. When idle, the actuators cut off passage 1, so that only the carrier gas flows into the device and the reagent is halted.

Figure 2:
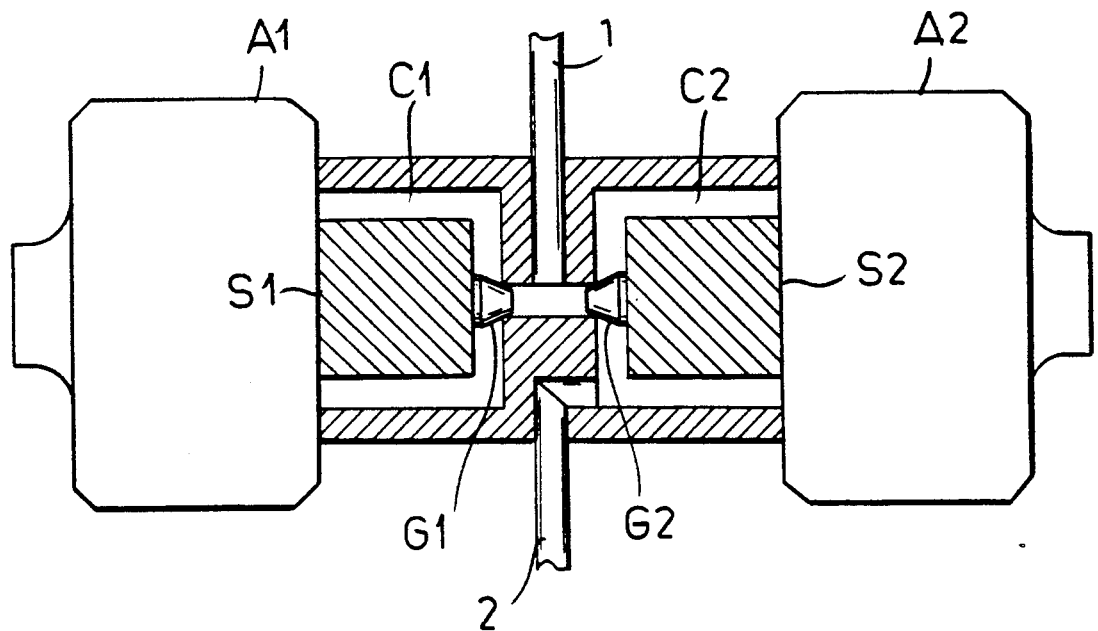
FIG. 2 is a partial longitudinal sectional view thereof.
Figure 3:
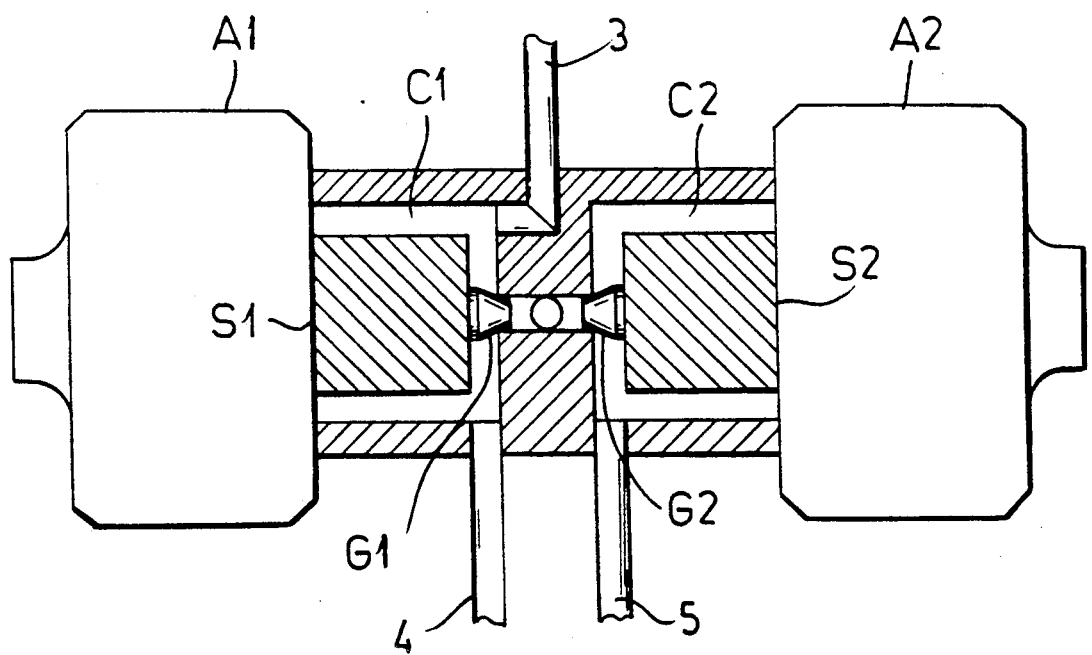
FIG. 3 is a partial longitudinal sectional view, perpendicular to that of FIG. 2.

In the sectional view, shown in FIG. 2, the internal device structure can be seen, except for actuators A1 and A2, which are of a type commercially available. Passage 1 ends in the middle of the segment of a perpendicular pipe, generally closed at its ends by two stem tips G1 and G2, drawn to opening position by bellows S1 and S2 belonging to pneumatic actuators A1 and A2. If actuator A2 is activated, stem tip G2 opens and lets the reagent flow from passage 1 to chamber C2. This chamber communicates permanently with passage 2 and way 5, visible in FIG. 3, wherethrough the carrier gas flows. If actuator A1 is activated and actuator A2 is reset, stem tip G1 opens and stem tip G2 closes, so that the reagent flow is diverted towards chamber C1. As this chamber communicates permanently with ways 3 and 4, shown in FIG. 3, reagent mixes with the carrier gas flowing therein.

I claim:

1. A device for introducing reagents into an organometallic vapor phase deposition apparatus which comprises:

an elongated unitary valve body formed with first and second pneumatic actuators at opposite axial ends of said body, each of said actuators having a respective compressed-air inlet;

five passages communicating laterally with said body between said actuators, said body being formed with a first and a second chamber respectively assigned to a first and a second of said actuators, said passages including a T-shaped first passage opening into said body between said chambers and communicating with both of said chambers;

second and third passages communicating continuously with said second chamber at opposite sides thereof and fourth and fifth passages communicating continuously with said first chamber at opposite sides thereof;

respective stem tips actuated by first and second ones of said pneumatic actuators for admitting flow from said first passage to said first chamber and from said first passage to said second chamber, respectively;

a source of a reagent connected to said first passage;

a reactor connected to said fifth passage;

a vent connect to said third passage; and a source of carrier gas connected to said second and fourth passages.

* * * * *